United States Patent [19]

Asselbergs

[11] Patent Number: 5,089,708
[45] Date of Patent: Feb. 18, 1992

[54] VACUUM SYSTEM COMPRISING AN EVACUATABLE HOUSING, AN OBJECT HOLDER AND AN OBJECT CARRIER WHICH IS DETACHABLY COUPLED THERETO

[75] Inventor: Peter E. S. J. Asselbergs, Eindhoven, Netherlands

[73] Assignee: U.S. Philips Corporation, New York, N.Y.

[21] Appl. No.: 597,925

[22] Filed: Oct. 11, 1990

[30] Foreign Application Priority Data

Oct. 17, 1989 [NL] Netherlands ............ 8902568

[51] Int. Cl.⁵ ............................................. H01J 37/20
[52] U.S. Cl. ..................... 250/442.11; 250/311; 250/310; 250/307
[58] Field of Search ............ 250/442.1, 311, 310, 250/307

[56] References Cited

U.S. PATENT DOCUMENTS

| | | | |
|---|---|---|---|
| 3,702,399 | 11/1972 | Lucas | 250/442.1 |
| 3,745,341 | 7/1973 | Sakitani | 250/442.1 |
| 3,952,203 | 4/1976 | Hoppe | 250/442.1 |
| 4,292,523 | 9/1981 | Hoppe | 250/442.1 |

FOREIGN PATENT DOCUMENTS 0260734 8/1987 European Pat. Off. .
6244942 2/1987 Japan .

OTHER PUBLICATIONS

C. J. Rakels, J. C. Tiemeijer and K. W. Witteveen, "The Philips Electron Microscope EM 300", Philips Technical Review, 1968, Number 12, vol. 29, pp. 370–386.

Primary Examiner—Jack I. Berman
Attorney, Agent, or Firm—William Squire

[57] ABSTRACT

In a vacuum system comprising an evacuatable housing, an object holder and an object carrier which is detachably coupled thereto, the object carrier in one form is constructed to rotate about one axis relative to the housing or in a second form rotates about an orthogonal axis and which forms are interchangeable. A supporting element of the object carrier is driven by a push member or by a piezo-electric element in different embodiments. The object carrier is introduced through a lock in a side wall of the vacuum system and can be coupled to and uncoupled from the object holder by means of a special tool.

26 Claims, 5 Drawing Sheets

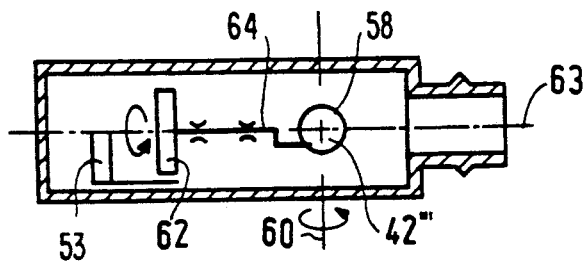
FIG. 6
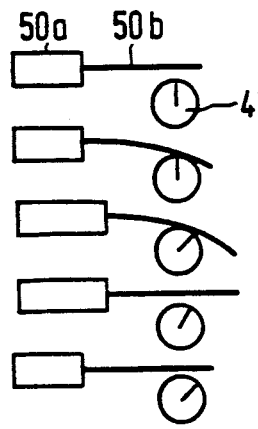
FIG. 7a
FIG. 7b
FIG. 7c
FIG. 7d
FIG. 7e
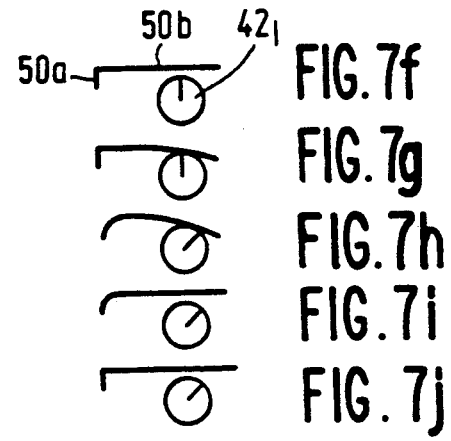
FIG. 7f
FIG. 7g
FIG. 7h
FIG. 7i
FIG. 7j
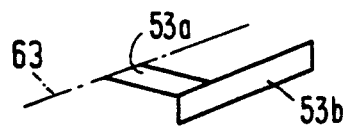
FIG. 7k
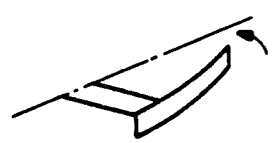
FIG. 7l
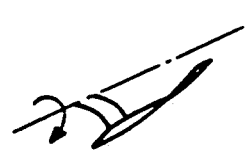
FIG. 7m
FIG. 7n
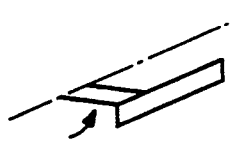
FIG. 7o

FIG. 9a
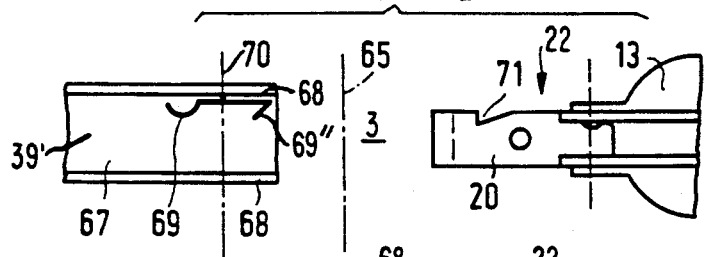
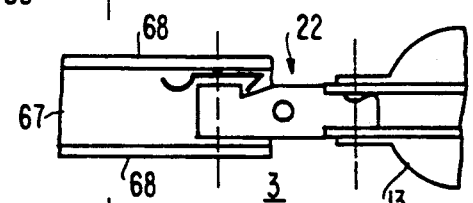
FIG. 9b
FIG. 9c
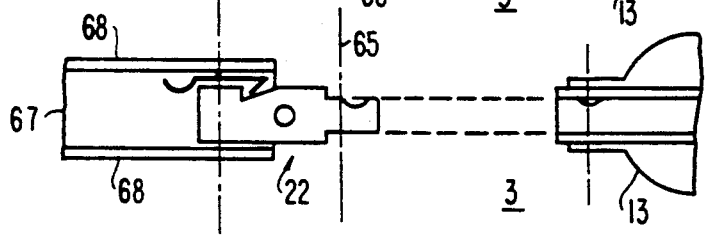
FIG. 9d
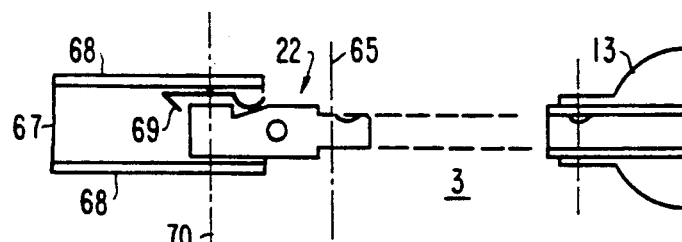
FIG. 9e
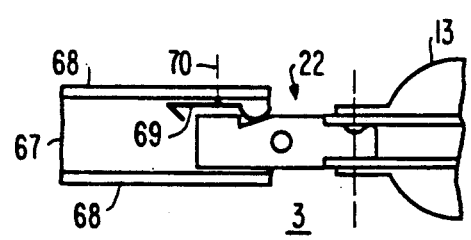
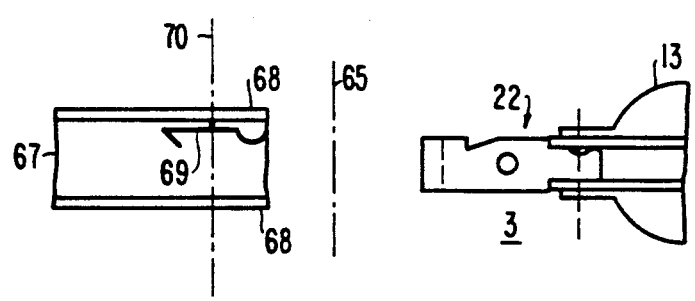
FIG. 9f

VACUUM SYSTEM COMPRISING AN EVACUATABLE HOUSING, AN OBJECT HOLDER AND AN OBJECT CARRIER WHICH IS DETACHABLY COUPLED THERETO

BACKGROUND OF THE INVENTION

1. Field of the Invention

The invention relates to a vacuum system, comprising an evacuatable housing, an object holder and an object carrier which is detachably coupled thereto. The object holder comprises positioning means which are situated partly within the housing and which serves to position an object in the housing. The object carrier comprises a supporting element having a supporting surface for the object and which is rotatable about an axis of rotation with respect to the object carrier. The carrier includes drive means which cooperates with the supporting element and the positioning means.

The invention also relates to an object carrier suitable for use in a vacuum system.

2. Description of the Prior Art

A vacuum system, notably an electron microscope, and an object carrier of the kind set forth are known from German Patent Specification DE which corresponds to U.S. Pat. No. 4,292,523.

The cited Patent Specification describes a vacuum system including an electron-optical column which comprises an object holder in the form of a table which is slidable with respect to an optical axis of the column. An object carrier in the form of an object cartridge is introduced into the vacuum system and is coupled to the table. The object carrier has a tubular shape and contains an object to be examined which is suspended from a supporting element. The supporting element is pivotable about an axis of rotation with respect to the object carrier, which axis of rotation extends transversely of the optical axis and parallel to a supporting surface engaging the object. The supporting element is connected to a spring at one side and to a push member on another side, which push member engages a cam ring connected to the column. A position of the object can be adjusted with respect to the optical axis by rotation of the cam ring by means of positioning means which comprise a flexible shaft which emerges from the column. An object carrier and object holder combination of this kind is mechanically stable, but occupies a comparatively large volume in the direction of the optical axis. As result, the number of feasible lens configurations are limited because the volume occupied by the object carrier precludes the presence of pole shoes of a magnetic lens. Furthermore, the known object carrier does not permit concentric object motions where the point of intersection of the axes of rotation is situated on the optical axis.

It is to be noted that an object holder of the kind set forth is known per se from: C. J. Rakels, J. C. Tiemeijer and H. W. Witteveen, "The Philips Electron Microscope EM 300", Philips Technical Review, Vol. 29, 1968, No. 12, pp. 370–386.

The cited article describes an object holder in an electron microscope in which the cylindrical member can be mvoed out of the vacuum space in order to provide a tip of the cylindrical member with an object. In that case the tip constitutes the object carrier. A rotation of an object about an axis of rotation extending parallel to the optical axis is achieved by rotation of the spherical bearing and is limited as regards angle of rotation.

In a known object holder, a cylindrical member is arranged so as to be detachable from a spherical bearing in order to enable an exchange of objects, so that permanent vacuum sealing is not possible and, for example, an O-ring must be used for sealing.

SUMMARY OF THE INVENTION

It is inter alia an object of the invention to provide a vacuum system which comprises an object holder and an object carrier whereby an object can be simply positioned in a plurality of positions with respect to a reference axis, for example, an optical axis. It is another object of the invention to provide an object carrier which has comparatively small dimensions and which is suitable for concentric rotation of an object supported by the object carrier with he optical axis.

To achieve this, in a vacuum system in accordance with the invention, a first and second object carrier are coupled to the object holder, the axis of rotation of the supporting element of the first object carrier extending transversely of the supporting surface, the axis of rotation of the supporting element of the second object carrier extending parallel to the supporting surface.

As a result of the use of exchangeable object carriers comprising supporting elements which are rotatable about different axes, an object to be examined can be correctly positioned as a function of an examination to be performed (for the determination of crystal orientations, rotation about the optical axis is desirable while for the determination of lattice defects rotation about an axis extending perpendicularly to the optical axis is desirable), without adaptation of the object holder connected to the column being necessary.

In an embodiment of a vacuum system in accordance with the invention, the object holder comprises a cylindrical member, which is surrounded at one end by a spherical bearing which closes off a part of a vacuum space bounded by the housing, which spherical bearing comprises an opening wherethrough the cylindrical member and the positioning means situated within the cylindrical member can be slid so as to penetrate the vacuum space.

When use is made of a vacuum system, the object carrier can be rotated about a point of intersection of the axis of rotation and a longitudinal symmetry axis of the cylindrical member. As result, an object part which is situated in the point of intersection remains in the same place, which is an advantage, for example in the case of electron microscopy.

The object holder of the cited article does not include a supporting element which is rotatable about an axis of rotation with respect to the object carrier. When use is made of an object carrier which is detachable from the object holder and which comprises a supporting element which is rotatable with respect thereto, the number of possibilities for object movement increases.

A further embodiment of a vacuum system in accordance with the invention is one in which the positioning means comprises push bar, a push member in the first object carrier being formed by a further push bar which extends transversely of the axis of rotation, one end of a spring being connected to the object carrier with its other end connected to the further push bar via a belt guided along a base.

When the positioning means and the push member are constructed as cooperating push bars, the supporting element can be simply rotated about an axis of rotation extending transversely of the supporting surface. The supporting element preferably comprises a round circumferential portion which engages one or more bearings supported by the object carrier. For the cooling of the object by means of liquid nitrogen or helium, it is attractive to construct the further push bar by using a thermally insulating material, for example, a ceramic material.

A further embodiment of a vacuum system in accordance with the invention is one where the positioning means comprises a push bar, the supporting element in the second object carrier comprising two side arms, one side arm cooperating with a resilient element, another side arm cooperating with the pivot member which has a two-armed construction and one arm of which engages the push ar. For rotation of the supporting element about an axis extending parallel to the supporting surface, an object holder is provided with a pivot member cooperating with the push bar.

Another embodiment yet of a vacuum system in accordance with the invention is one wherein the drive means comprises a piezo-electric element, the positioning means and the object carrier comprising cooperating electrical contact points.

Because the object holder is electrically connected to the positioning means in order to control the piezo-electric element, which positioning means comprise two electrical conductors in that case, moving parts need not be passed through a column wall. Vacuum sealing is thus implified and thermal insulation of the object is easy because no conduction takes place via the push bar.

Another embodiment of a vacuum system in accordance with the invention is one wherein in a wall of a housing there is a vacuum lock, situated opposite the object holder, for introducing the object carrier into the housing.

When the object carrier is introduced into the housing through a vacuum lock, the object holder may have a simple construction. A permanent vacuum seal in the form of, for example a bellows between an inner wall of the spherical bearing and an outer wall of the cylindrical member is thus possible.

Still another object embodiment of a vacuum system in accordance with the invention is characterized in that via the lock a tool can be coupled to the object carrier in order to uncouple the specimen carrier from the coupling means. Coupling of an object carrier in the housing to the object holder is facilitated by using a special tool which comprises a pawl which cooperates with a cam in the object carrier.

BRIEF DESCRIPTION OF THE DRAWING

Some embodiments of a vacuum system in accordance with the invention will be described in detail hereinafter with reference to the accompanying drawing. Therein:

FIG. 6 is a plan view of a second object carrier in accordance with an embodiment of the invention, the drive means comprising a piezo-electric element;

FIGS. 7a to 7g diagrammatically show some embodiments of the drive means in accordance with the invention;

FIGS. 9a and 9f are plan views of a tool in accordance with the invention.

DESCRIPTION OF THE PREFERRED EMBODIMENTS

Figure 1:
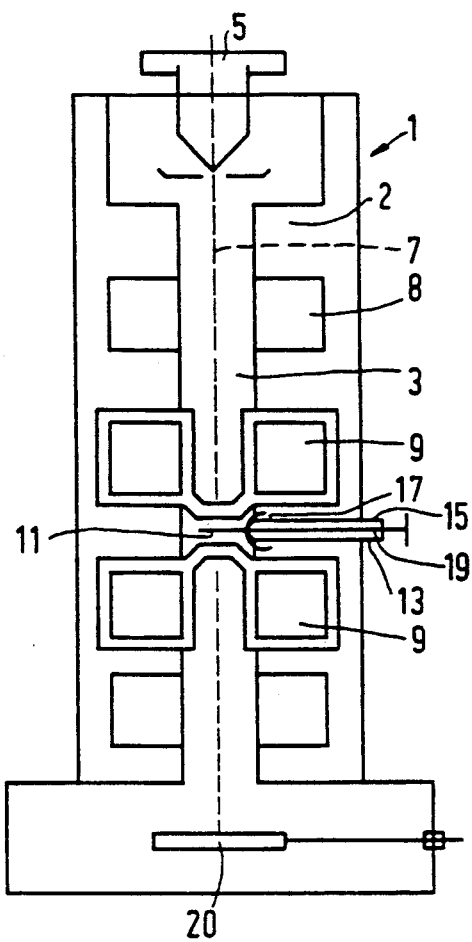
FIG. 1 is a diagrammatic representation of a vacuum system comprising an object holder.

FIG. 1 shows a vacuum system in the form of an electron microscope which comprises an electron-optical column 1 provided with a evacuated chamber 3, surrounded by an evacuatable housing 2, and an electron source 5. The electron source 5 emits an electron beam along an optical axis 7 of the column 1. Using electro-magnetic condensor lenses 8, the electron beam is focused onto an object arranged in an objective lens 9. The objective lens 9 comprises coils with turns which are provided with a soft-iron envelope and core, and pole shoes which are spaced, for example 1 cm apart in a direction of the optical axis. In a gap between the pole shoes of the lens 9 there is arranged an object which is supported by an object carrier 11. The object carrier 11 is coupled to an object holder 13 which comprises a cylindrical member 15 which is connected to the evacuated housing 2 via a spherical baring 17. Via the spherical bearing the cylindrical member 15 enters the housing 2 in chamber 3 of which a pressure amounts to, for example $10^{-9}$ Torr. In the cylindrical member there are arranged positioning means 19 in the form of, for example, a push bar which is displaceable by cooperation of a thread and a nut in a direction which is oriented transversely of the optical axis 7 in the housing 2. After irradiation of the object supported by the object carrier 11, the electron beam is incident on a detector 20 on which an enlarged image of the object is formed (for example, magnification $10^5$). The detector 20 comprises, for example, a fluoroescent screen. Using the object holder 13, an object can be moved to different positions with respect to the optical axis 7, so that an angle of incidence of the electron beam incident on the object is varied. It is attractive when two mutually perpendicular axes of rotation and the optical axis 7 intersect in one point. An image of a part of the object situated in this point will retain its orientation when the object is tilted. The object carrier 11 can be rotated through a limited angle in a plane extending perpendicular to the optical axis 7 by rotation of the spherical bearing 17. However, the object is then displaced with respect to the optical axis 7. For some examinations of the object, for example, examination of a crystal structure on the basis of diffraction patterns, it is desirable to rotate the object through an angle of 360° in a plane perpendicular to the optical axis at a speed of rotation of between $0.1°s^{-1}$ and $10°s^{-1}$ with an accuracy of 0.1° and reproducibility of 0.5°. Furthermore, for suitable imaging during examination, the object carrier should not exhibit a drift in excess of $0.133 \cdot 10^{-1}$ ms$^{-1}$ at room temperature and a vibration amplitude should be less than approximately $0.8 \times 10^{-10}$ m. For other examinations, for example, three-dimensional image reconstruction, a rotation of the object carrier about an axis extending perpendicular to the optical axis 7 is required when similar requirements are imposed as regards accuracy and reproducibility.

Figure 2:
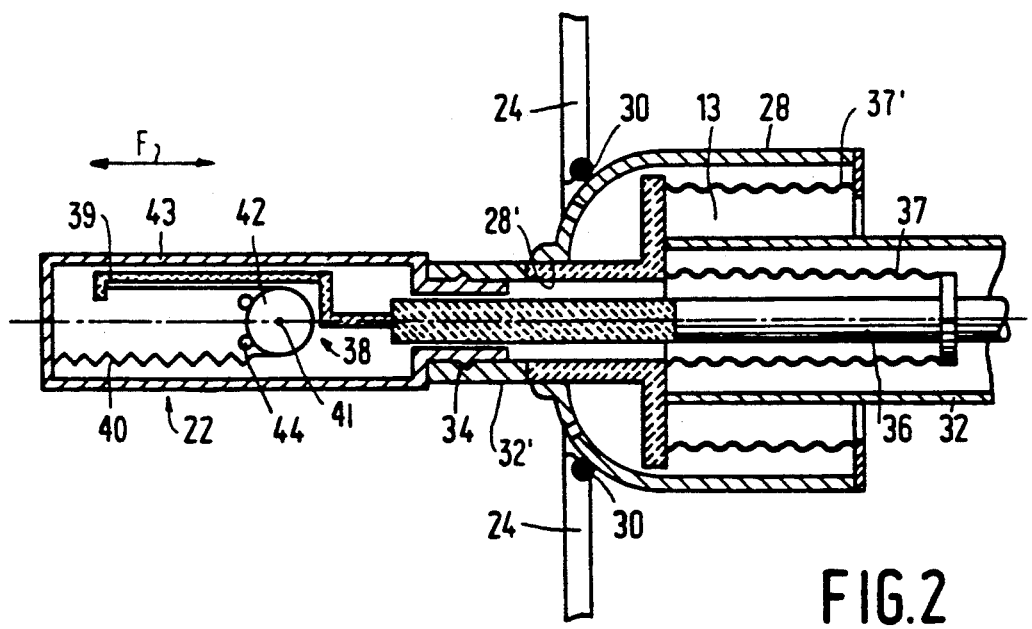
FIG. 2 is a plan view of an object holder and a first object carrier in accordance with an embodiment of the invention, the drive means comprising a push bar.

FIG. 2 shows an object holder 13 whereto an object carrier 22 is detachably coupled, which object carrier is situated within the evacuated chamber 3 surrounded by a wall 24 (partly shown). A length of the object carrier 22 amounts to, for example 30 mm, a width being between 6 and 12 mm. The object carrier 22 comprises a spherical bearing 28 which closes off a part of the chamber 3 and which is movably coupled to the wall 24 by way of an O-ring 30. A cylindrical member 32 has a cylindrical portion 32' which enters the chamber 3 through an opening 28 in the spherical bearing 28. The member 32 portion 32' is coupled to the object carrier 22 via a clamping coupling 34. In the cylindrical member 32, displaceable in the plane of drawing in the direction of double arrow F, there is a positioning push bar 36. Drive means 38 in the object carrier 22 are coupled to and cooperate with the push bar 36. The drive means 38 comprises a push bar 39 and a spring 40 connected to the push bar 39. The spring 40 may be constructed as a helical spring or as a spiral spring in a drum. Movement of the push bar 39 driven by the push bar 36 outside the chamber 3, causes rotation of supporting element 42 about an axis 41 which extends perpendicular to the plane of drawing. The push bar 39 is positioned and guided by a bearing 43, the supporting element 42 being guided along a bearing 34. The bearings consist, for example, of sapphire which is highly wear-resistant. The shaded parts in the drawing are made of a thermally insulating material so as to provide thermal insulation for cooling of an object arranged in the supporting element 42 by means of liquid nitrogen or helium. A cylindrical bellows 37 surrounds a portion of bar 36 and is connected to portion 32'. Bellows 37 seals the chamber 3 for receiving the vacuum. A permanent vacuum is present between the inner wall of bearing 28, a second cylindrical bellows 37' and the outer wall of member portion 32'.

Figure 3:
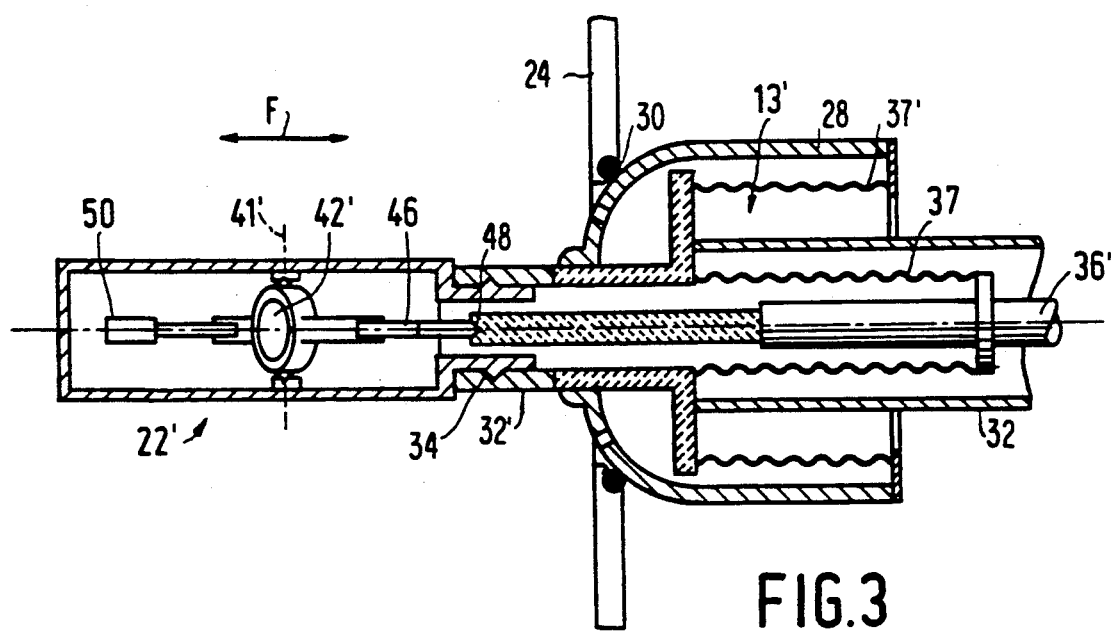
FIG. 3 is a plan view of an object holder and a second object carrier in accordance with an embodiment of the invention, the drive means comprising a pivot member.

FIG. 3 shows the object holder 13 whereto there is coupled an object carrier 22' with a supporting element 42' which is rotatable about an axis 41'situated in the plane of drawing. The supporting element 42' is connected to push bar 36 via two armed drive pivot member 46. Movement of the push bar 36' in directions F causes rotation of the supporting element 42' about the axis 41. Because the drive of the object carriers 22 and 22' cooperate with the respective push bars 36 and 36' in order to achieve a rotation of the supporting element about the axis 41' and, in the case shown in FIG. 2, rotation about the axis 41 perpendicular to the plane of drawing, the axis of rotation of the object can be changed simply by exchanging the object carrier 22 with carrier 22' sealing of the chamber 3 is realized by bellows 37.

Figure 4:
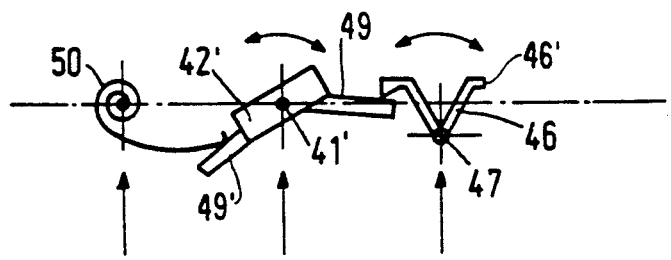
FIG. 4 is a side elevation of drive means in a second object carrier in accordance with an embodiment of the invention.

FIG. 4 is a side elevation of the supporting element 42' of FIG. 3 and the two-armed pivot member 46 coupled thereto. The supporting element 42' comprises two side arms 49 and 49', one side arm being resiliently engaged by a resilient element 50, the other side arm 49 engaging pivot member 46 for rotation of element 42' about the axis 41, perpendicular to the plane of drawing in the present Figure.

The pivot member 46 is, for example V-shaped, can be tilted about a pivot axis 47 which extends parallel to the axis of rotation 41', and comprises a contact portion 46' which cooperates with a recess 48 in the push bar 36' (and in the push bar 36, FIG. 2). The spring 50 causes contact portion 46' to remain engaged with recess 48.

Figure 5:
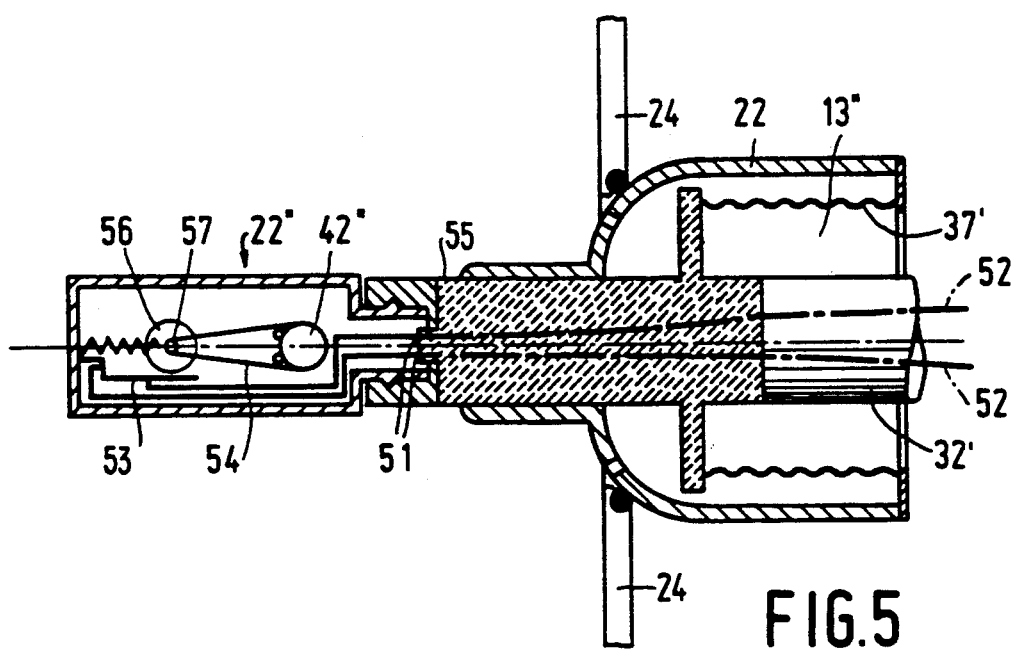
FIG. 5 is a plan view of an object holder and a firs object carrier in accordance with embodiment of the invention, the drive means comprising a piezo-electric element.

FIG. 5 shows an object holder 13 coupled to object carrier 22''. The drive means comprise a piezo-electric element 53. The piezo-electric element 50 is connected, via electrical contact points 51 in rod 55, to electrical contact points of a positioning control means which are in his case formed by two electrical conductors 52 in rod 55. Element 53 contracts or expands as a function of applied via conductors 52. The supporting element 42'', being rotatable about an axis extending perpendicular to the plane of drawing, is connected to a pulley 56, via a closed loop 54. The pulley 56 is also rotatable about an axis which extends perpendicular to the plane of drawing. The loop 54 is preferably guided about a further cylindrical pulley portion 57 of the pulley 56, so that a circumferential side of the pulley 56 engages the piezo-electric element 53. Element 53 exerts a force on the circumferential side of pulley 56 in a tangential direction of the pulley 56. The cylindrical member 32 of the rod 55 of the present embodiment is substantially solid and has a recess for passage of the conductors 52. An advantage of a piezo-electric element drive is that no moving parts are passed through the wall 24, so that the vacuum sealing may be simpler. It is sufficient to insert, for example, one bellows 37' between the spherical bearing 28 and the cylindrical member 32' rather than the two bellows 37 and 37' of FIGS. 2 and 3. Furthermore, when the piezo-electric element 53 is controlled in a number of discrete voltage steps, a measure of an angular displacement of the supporting element 42'' can be simply obtained by counting the number of voltage steps. A variation of the length of the piezo-electric element amounting to 7 $\mu$m results in an angular rotation of 0.1°) when a radius of the supporting element is 2 mm and a radius of the pulley 56 is 4 mm. For an angular velocity of 10°s$^{-1}$ of the supporting element 42, the piezo-electric element 53 is controlled by a voltage of some hundreds of volts at a frequency of 100 Hz. For an operating frequency of 100 Hz, deflections of the object carrier remain within the order of magnitude of $0.533 \cdot 10^{-10}$ m, thus avoiding adverse effects on the sharpness of the image in the case of a high enlargement factor.

FIG. 6 shows a second embodiment of an object carrier in which the drive means comprises a piezo-electric element 53. A supporting element 42'' is rotatable about an axis 60 which extends parallel to the supporting surface 58 of the supporting element 42''. The drive means also comprises a pulley 62 which is rotatable about an axis 63 which extends transversely of the axis 60. Via a pawl 64, the pulley 62 is coupled to the supporting element 42''' so that the supporting element 42''' is pivoted about the axis 60 upon rotation of the pulley 62. The pawl 64 is partly eccentric relative to the pulley 62.

FIGS. 7a-7e show an embodiment of the piezo-electric element 53 which comprises a first portion 50a which includes, for example a piezo-electric stack which is capable of expansion in a tangential direction of the supporting element 42, and a portion 50b which is movable in a radial direction of the supporting element 42. The portion 50b comprises, for example, a bimorphous piezo-electric element 42. Angular rotation of the supporting element is realized by successive expansion and contraction of the portions 50a and 50b. In FIGS. 7f-7j the portion 50a is again formed by a bimorphous piezo-electric element. The drive means of the object holder as shown in the FIGS. 7a-7g and 7f-7j are suitable for driving the supporting element 42 about an axis extending perpendicularly to the supporting element. FIGS. 7k-7o shows the drive means for rotating the supporting element 42''' about an axis extending parallel to the supporting surface 58 in an object carrier as shown in FIG. 6. The portions 53, and 53b both comprise a bimorphous element. First the portion 53b is made to engage the pulley 62 (not shown in this Figure), after which the portion 53 rotates about the axis 63. Subsequently, the element 53b straightens so that contact with the circumferential side of the pulley 62 is interrupted and the portion 53a rotates back to its initial position.

Figure 8A:
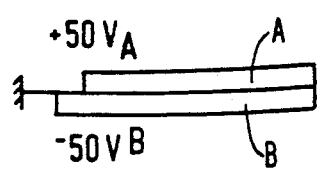
FIGS. 8a to 8j diagrammatically show drive means in accordance with the invention and also the variation of an appropriate control voltage.
Figure 8E:
Figure 8B:
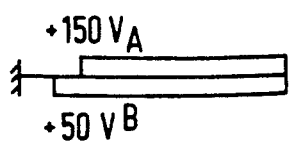
Figure 8F:
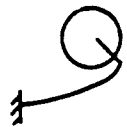
Figure 8C:
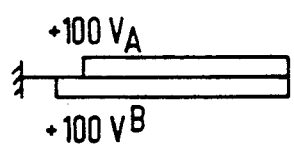
Figure 8G:
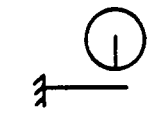
Figure 8:
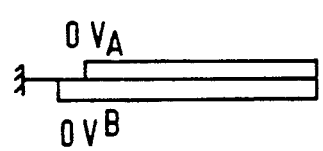
Figure 8H:
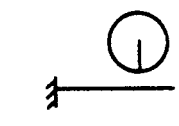
Figure 8I:
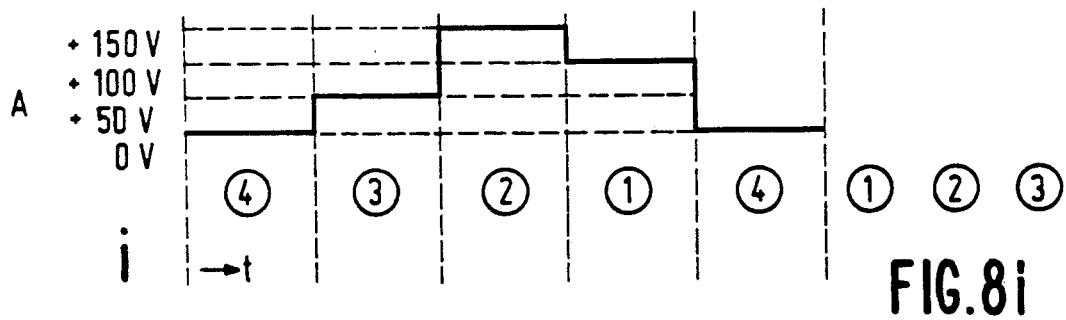
Figure 8J:
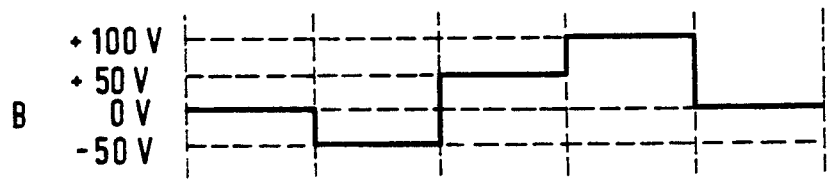

FIGS. 8a-8j shows a further version of the drive means which in this case comprise only one bimorphous element. Two oppositely polarized portions of piezo-electric material A and B are mounted one on the other. By applying voltages to the portions A and B as shown in FIGS. 8i and 8j respectively, where A becomes shorter and B becomes longer, A becomes shorter and B becomes shorter, A becomes longer and B become shorter, and A becomes longer and B becomes longer, respectively, the supporting element 42''' is rotated about an axis extending transversely of the supporting surface.

FIGS. 9a-9c illustrate how a tool 67 can be introduced into the chamber 3 through a lock 65 situated opposite the object holder 13 for removing the object carrier 22 from the chamber 3. The tool 67 comprises two tongues 68 which fit around the object carrier 22, one tongue supporting a pawl 69 which is rotatable about an axis 70. One end of the pawl 69 comprises a rounded portion 69', another end comprising a hook 69''. For decoupling the object carrier 22 from the object holder 13, the hook is made to engage the cam 71, after which the object carrier is uncoupled from the object holder 13 by withdrawing the tool 67 through the lock 65. FIGS. 9d-9f show the coupling of the object carrier to the object holder. The object carrier is arranged between the tongues 68 of the tool 67, the cam 71 being brought into a detent type clamping engagement with the rounded portion of the pawl 69. The object carrier 22 is then clamped to the object holder 13, after which the tool 67 can be removed from the chamber 3. The rounded portion of the pawl 69 slides out of the cam 71 and the object carrier remains in the chamber 3 secured to holder 13.

It is to be noted that the use of an object carrier and an object holder according to the invention is not restricted to electron microscopy; they are also suitable for use in, for example, X-ray spectrometry apparatus or micro chip manufacturing and inspection apparatus.

What is claimed is:

1. A vacuum system with interchangeable object carriers comprising:
    a housing having an evacuatable chamber;
    an object holder including object positioning means coupled to said housing for positioning an object in the chamber;
    a plurality of object carriers each including means for detachably securing that carrier to the holder, each carrier including an object supporting element having an object supporting surface rotatable about an axis relative to that carrier, the supporting surface of a first carrier's supporting element being rotatable about an axis transverse to that supporting surface and the supporting surface of a second carrier's supporting element being rotatable about an axis parallel to its supporting surface; and
    drive means coupled to each of said carriers and responsive to the positioning means for rotating said supporting surfaces of said elements about their respective axes.

2. A vacuum system as claimed in claim 1 wherein the drive means comprises a spring having opposing ends and a push member cooperating with the positioning means, the positioning means comprising a push bar, the push member of the first object carrier being formed by a further push bar which extends transversely of the axis of rotation of the element of that carrier, one end of the spring being connected to that object carrier while its other end is connected to the further push bar.

3. A vacuum system as claimed in claim 2, wherein the spring comprises a spiral spring.

4. A vacuum system as claimed in claim 2, wherein the further push bar engages a bearing supported by that object carrier.

5. A vacuum system as claimed in claim 2, wherein the further push bar is made of a thermally insulating material.

6. A vacuum system as claimed in claim 1 wherein the second object carrier comprises drive means in the form of a spring and a two-armed pivot member which cooperates with the supporting element of that carrier and which is pivotable about a pivot axis extending parallel to the supporting surface of that element, the positioning means comprising a push bar, the supporting element in the second object carrier comprising two side arms, one side arm cooperating with a resilient element, the other side arm cooperating with one arm of the pivot member the other arm of which engages the push bar.

7. A vacuum system as claimed in claim 1, wherein the drive means comprise a piezo-electric element, the positioning means and the object carrier comprising cooperating electrical contact points.

8. A vacuum system as claimed in claim 7 wherein the drive means in the first object carrier comprises a pulley which is rotatable by the piezo-electric element about a further axis which extends parallel to the axis of that carrier, which pulley is coupled to the supporting element via coupling means for transmitting a rotation about the axis of that carrier.

9. A vacuum system as claimed in claim 8, wherein the pulley comprises a cylindrical pulley portion which is coaxially connected to the pulley, the coupling means comprising a belt which is arranged around the cylindrical portion and the supporting element in a closed loop.

10. A vacuum system as claimed in claim 9, wherein the pulley is connected to a spring for tensioning the loop.

11. A vacuum system as claimed in claim 7 wherein the drive means in the second object carrier comprises a pulley which is rotatable by the piezo-electric element about a further axis which extends transversely of the axis of rotation of the element of that carrier, said pulley being coupled to the supporting element by way of a pawl which is at least partly eccentric with respect to the pulley.

12. A vacuum system as claimed in claim 8 wherein the piezo-electric element comprises a portion which is movable in a tangential direction with respect to the pulley and also comprises a further portion which is connected to said portion and which is movable in a radial direction with respect to the pulley.

13. A vacuum system as claimed in claim 12, wherein at least one of said portions comprises a bimorphous element, the portions extending transversely of one another.

14. A vacuum system as claimed in claim 7 the piezo-electric element is formed by one bimorphous element.

15. A vacuum system as claimed in claim 1 including a vacuum lock in a wall of the housing, said lock being situated opposite the object holder, for introducing the object carrier into the housing.

16. A vacuum system as claimed in claim 15 wherein said lock and carrier include means so that a tool can be coupled to the object carrier to uncouple the carrier from the coupling means.

17. A vacuum system as claimed in claim 16 wherein the tool comprises at least two tongues for engaging the object carrier, the object carrier being provided with a cam, one tongue of the tool comprising a pawl which cooperates with the cam, an end of said pawl comprises a hook, a second end of the pawl comprising a rounded portion, said pawl being rotatable about an axis extending transversely said one tongue.

18. A vacuum system as claimed in claim 1 wherein characterized in that the housing comprises an electron-optical column.

19. A vacuum system as claimed in claim 1 wherein the chamber has an opening and the object holder comprises a cylindrical member having opposing ends and which is surrounded at one end by a spherical bearing which closes off a part of the chamber opening, said spherical bearing having an opening, said positioning means being situated within the cylindrical member and arranged to to penetrate the chamber.

20. A vacuum system as claimed in claim 19 wherein the supporting element comprises a round circumferential portion which engages at least one bearing supported by the object carrier.

21. A vacuum system as claimed in claim 20, wherein the bearings are made of sapphire.

22. A vacuum system as claimed in claim 19 wherein the spherical bearing has an inner wall, said cylindrical member having an outer wall, to and between said inner wall of the spherical bearing and said outer wall of the cylindrical member there is provided a permanent vacuum seal.

23. A vacuum system as claimed in claim 22 wherein the vacuum seal comprises a bellows.

24. In a vacuum system including a housing having an evacuatable chamber and an object holder including object positioning means coupled to the housing for positioning an object in the chamber, the combination therewith comprising:
   a plurality of carriers each including means for detachably securing that carrier to the holder, each of said plurality of carriers supporting an object supporting element having an object supporting surface rotatable about an axis relative to that carrier; and
   drive means secured to the housing and adapted to be coupled to a selected one of said carriers and responsive to the positioning means for rotating said supporting surface of said element of the selected one of said carriers about its axis, each supporting element being rotatable about a different axis relative to the axes of the other of the supporting elements of the others of said carriers.

25. The system of claim 24 wherein the drive means comprises piezo-electric means.

26. The system of claim 24 wherein the drive means comprises link means adapted to be coupled to the element of a selected carrier and to said positioning means.

* * * * *